United States Patent [19]
Hughes

[11] Patent Number: 5,106,288
[45] Date of Patent: Apr. 21, 1992

[54] LASER BASED PLASTIC MODEL MAKING WORKSTATION

[75] Inventor: John L. Hughes, Glen Waverley, Australia

[73] Assignee: Austral Asian Lasers Pty Ltd., Melbourne, Australia

[21] Appl. No.: 459,779

[22] PCT Filed: Apr. 11, 1989

[86] PCT No.: PCT/AU89/00156
§ 371 Date: Jan. 24, 1990
§ 102(e) Date: Jan. 24, 1990

[87] PCT Pub. No.: WO89/09687
PCT Pub. Date: Oct. 19, 1989

[30] Foreign Application Priority Data
Apr. 11, 1988 [AU] Australia .................. PI7690

[51] Int. Cl.$^5$ .............................. B29C 35/08
[52] U.S. Cl. .................. 425/174.4; 118/620;
156/58; 156/272.8; 156/273.3; 156/379.6;
264/22; 264/255; 264/308; 365/120; 425/162;
427/54.1
[58] Field of Search ............ 425/112, 161, 162, 174.4,
425/375; 264/1.4, 1.7, 22, 250, 255, 308;
156/58, 59, 242, 272.2, 272.8, 273.3, 273.5,
275.5, 379.6, 538; 365/106, 107, 119, 120, 126,
127; 427/43.1, 54.1; 118/695, 697, 620, 500

[56] References Cited
U.S. PATENT DOCUMENTS

| | | | |
|---|---|---|---|
| 2,775,758 | 12/1956 | Munz | 156/58 |
| 4,078,229 | 3/1978 | Swainson et al. | 365/107 |
| 4,575,330 | 3/1986 | Hull | 425/174.4 |
| 4,752,498 | 6/1988 | Fudim | 264/22 |
| 4,942,060 | 7/1990 | Grossa | 264/22 |

FOREIGN PATENT DOCUMENTS 2567668 1/1986 France .................. 425/174.4

OTHER PUBLICATIONS

Kodoma, Hideo, "Automatic Method for Fabricating a Three-Dimensional Plastic Model with Photo-Hardening Polymer", Rev. Sci. Instrum., vol. 52, No. 11, Nov. 1981, pp. 1770-1773.

Lindsay, Karen, "Desktop Product Prototyping: Services and Systems Proliferate", Modern Plastics, Jul. 1989, p. 90.

Primary Examiner—James C. Housel
Attorney, Agent, or Firm—Dvorak and Traub

[57] ABSTRACT

A system for producing precision plastic products via the polymerization of liquid plastics using combined static ultra-violet laser stencil imaging with dynamic focused ultra-violet laser beams is provided. Computer control of the position of the laser beams relative to the face of a computer controlled adjustable pattern immersed in the liquid plastic allows for the hardened plastic product being produced to rest on an end face of the piston as the computer controlled laser beam profiling processes takes place within the liquid plastic.

11 Claims, 5 Drawing Sheets

LASER BASED PLASTIC MODEL MAKING WORKSTATION

FIELD OF THE INVENTION

This invention relates to a system for producing precision plastic products via the polymerisation of liquid plastics using focussed ulta-violet laser beams whose computer controlled positioning relative to the face of a computer controlled adjustable piston immersed in the said liquid plastic allows for the hardened plastic product being produced to rest on the said end face of said piston as the computer controlled laser beam product profiling processes take place within the liquid plastic.

The system is particularly suitable for the transformation of a computer software product design into a three dimensional, hard plastic copy. The system has application in the production of all-plastic credit and identification cards, plastic models of buildings, toys, letters, numbers, tools, moulds and dies.

DESCRIPTION OF THE PRIOR ART

Prior art laser beam induced plastic model production systems used commercially available two mirror scanners which deflected a single laser beam in two mutually perpendicular directions and projected it into the liquid plastic to be polymerised. The third dimension polymerisation process was accomplished by using a zoom lens to adjust the focal length of the scanned laser beam. The major problem with these prior art laser systems was the fact that the scanner mirrors were of necessity relatively small to minimise inertial effects which would adversely affect the response time of the scanning system if larger mirrors were used. The fact that mirror scanning systems used in prior art systems had of necessity small aperture mirrors led to severe restrictions being placed on the power of the laser beam and its focal length, the smaller the scanner mirror, the larger the focal length and the more extended the focus region. The longer the focal length of the scanned laser beam, the greater is the leverage effect which in turn amplifies any jitter that the movement of the scanning mirror could exhibit, which in turn would degrade the quality of the polymerisation process, seriously limiting the image resolution achievable.

Prior art systems also utilized other techniques than scanning mirrors to profile the plastic models in three dimensions, namely, the projection of photographic images. These fixed stencil images had to be projected into open tanks of liquid plastics or onto a base coated with a thin layer of the said plastic. The problem with such fixed stencil image generation is well known in product marking applications where only the same level of information can be transmitted to each different product with a given fixed stencil. Prior art systems suffered from the fact that they used open tanks of liquid plastics implying that the ratio of the volume of liquid plastic to the volume of the product was large. Such large expensive volumes of liquid plastic proved difficult to keep clean during the polymerisation process, due to the difficulties associated with recirculating and filtering such large amounts of liquid plastics.

Prior art systems also suffered from the fact that they could not achieve coarse and fine polymerisation processes simultaneously during the manufacture of the three dimensional plastic models. It is often the case that a given model can be rapidly produced over its volume where its dimensions are not critical whilst it is always a relatively slower process to achieve the highest precision during any manufacturing process.

My invention overcomes the defects of prior art systems by confining the polymerisation process to within a narrow layer of liquid plastic defined by the space separating an optical window at one end of said liquid plastic tank and the end face of a computer controlled piston within said liquid tank through which said liquid plastic is circulated, having been filtered external to the tank during the recirculating process. The flow of liquid plastic between the inner surface of the optical window of said tank and the face of the movable piston can be separated from said surfaces via either a flow of transparent fluid or a transparent solid material in the case of said window and a material base, which need not be optically transparent. In the case of the said piston face. The said piston can also be rotated relative to the entrance window into said tank of liquid plastic which allows for, in the case where the surface area of said piston is greater than the area of said entrance window, the manufactured product to be easily removed from the region of polymerisation after it has been completed.

My invention differs from the prior art systems in that it incorporates both dynamic and static laser beam projection into the liquid plastic either separately or simultaneously. Furthermore, in the case of the static laser beam imaging, said image of the cross-section of the product can be changed in real time in a manner that corresponds to computer controlled settings of said piston within the plastic tank or to the position of the sharply focussed image of the cross-section of the product within the liquid plastic tank.

BACKGROUND OF THE INVENTION

This invention originated from the pioneering effort of the inventor in the development of laser radar since 1963 starting at the Royal Radar Establishment in Malver, U.K. Laser radar is particularly attractive for ranging to targets which are in environments which themselves provide radar reflections if the beamwidth of the said radar is too large. For example, low flying aircraft are difficult to detect with microwave radar whose beamwidth not only covers the target but also the ground over which it flies. On the other hand, very narrow beamwidth laser radar can emit a laser beam whose width is so narrow that only a small portion of said target intercepts said beam so that no ground clutter results and the detected signal to noise ratio is very large. Having perfected the technique of pinpointing the range of the low flying target, one needs more information to identify said target and this can only be achieved effectively by either broadening the said laser beamwidth to illuminate the whole target or by scanning the narrow beamwidth across the whole target. Once the techniques to scan such narrow beamwidth laser beams in two dimensions were mastered, it became possible to scan the said targets in three dimensions. Hughes 1980 (U.S. patent classified).

The commercial spin-offs of this defence technology is obvious in many areas but in particular in the recording and projection of three dimensional static and moving images (Hughes, co-pending patents). In these processes, the three dimensional image is built up laser spot by laser spot within a scattering medium. For example, if it needs one hundred spots to define one edge of a cube, it will need one million such spots to project a cube of one centimeter per side. To avoid flicker to the observer, such a cube image would have to be projected at thirty frames per second implying the generation of thirty million spots per second is needed to generate a flicker free, three dimensional image of a cubic centimeter in volume.

However, if such an image was projected inside a medium such as liquid plastic using an ultra-violet laser beam, then a hard-copy, three dimensional model of said image would result. Similarly, if such a laser beam imaging technique was used to sculpture a solid object, a three dimensional hard copy of the image would result.

Applying laser radar three dimensional laser beam target imaging techniques to the polymerisation of liquid plastics we establish an avenue involving the use of computer controlled laser beam image profiling or in other words dynamic beam image profiling. However, the fact that the phased-array lasers used in advanced laser radar systems, which have output apertures consisting of a large number of individual laser beam transmitters, are capable of emitting their output beams in the form of high quality, real time images simply by the selective switching of the individual transmitters (Hughes U.S. Pat. No. 4,682,335 issued July 1987) which allows an appropriate real time image stencil to be impressed onto a laser beam at the high power levels necessary for liquid plastic polymerisation. A similar result can be achieved using liquid crystal light valve based laser beam imaging systems (Hughes. U.S. Pat. No. 4,586,053 issued Apr. 29th, 1986) which allows an appropriate real time image stencil to be impressed onto a laser beam at low power levels and amplified to the higher power levels necessary for liquid plastic polymerisation. These static beam imaging techniques will be referred to as static beam image profiling.

In the dynamic beam mode, it is advantageous to project the focussed laser beam into the liquid plastic tank as near as possible to the normal to the entrance window in order to avoid parallax effects which occur from non-normal incidences. This gives rise to a range of laser beam manipulation techniques depending on whether or not each laser beam is deflected by one or more mirrors. Once set for normal incidence across the window surface, the incidence laser beam can be deflected in a precise, computer controlled manner around normal incidence, the laser beam scanner described by Hughes (U.S. Pat. No. 4,209,253 issued June 1980) is effective. In this way, the relatively slow mutually orthoganal movement of the incident laser beam over the whole aperture of the tank window is adequately compensated for by very rapid polymerisation product profiling within the liquid plastic tank around the region of the laser beam normal incidence at any given point on the aperture of the entrance window into said tank.

A high quality, focussed laser beam image can be projected into the said liquid plastic tank through its entrance window in the form of a real time stencil produced as described by Hughes (U.S. Pat. No. 4,586,053 issued Apr. 29th, 1986). For a given setting of the piston within said liquid plastic tank, the projected laser beam image is set to the appropriate cross-sectional configuration of the three dimensional plastic model to be produced via the imaged ultra-violet laser beam induced plastic polymerisation process within the said tank of liquid plastic. If said images are originally produced at other than ultra-violet wavelengths, they can be frequency shifted into the ultra-violet region by using techniques known in the art.

By combining the dynamic, focussed laser beam polymerisation process in liquid plastic with the static, real time stencil laser beam imaging polarization process in liquid plastic it is possible to generate the fine structure via the high resolution beam imaging plastic polymerisation process with the less accurate, but much more rapid, dynamic laser beam polymerisation process which is used to fill in the areas not demanding the highest resolution in the manufacturing of plastic models, for example the internal body structures.

Phased-array lasers, for example laser diode array, phased-array lasers and fibre bundle based phased-array lasers, emit their outputs from as many as one million minute transmitters per square centimeter of their output aperture. Even in their non-phased-locked format and with appropriate beam collimation, such lasers are capable of emitting their outputs in the form of high resolution images which can then be projected into the liquid plastic tank of the present invention. When coherently phased-locked across their output apertures the output beams of such lasers can be scanned without the use of mirrors, the processes having response times of the fastest electro-optic switches in the art at a particular development period. For example, if an electro-optic switch with a ten nanosecond ($10^{-8}$ seconds) response time is available, as has been the case for many years past, then it is possible to scan to output beam of a coherently phased locked, phased-array laser in a period of ten nanoseconds and to repeat this processes one hundred million times per second provided the switching means can stand up to the task. New switching techniques for scanning the output beams of phased-array lasers are being intensely developed worldwide and the situation is likely to rapidly improve which in turn implies that the use of such phased-array lasers in this invention will lead to continual improvement in the production of the laser induced polymerised plastic models.

SUMMARY OF THE INVENTION

It is an object of the invention to move the sharply focussed region of a focussed, ultra-violet laser beam inside a layer of liquid plastic via computer control of laser beam deflecting mirrors such that the liquid plastic is hardened in such a manner that the plastic model being manufactured is built up on the face of a computer controlled piston on which said model rests is lowered within a tank of liquid plastic.

Another object of the invention is to provide an enclosed tank through which liquid plastic is flowed between the inner surface of an optically polished entrance window and the surface of a computer controlled, movable piston, the flowing liquid plastic being filtered external to the said tank, to remove any polymerised plastic debris, before being retained in the most pure possible state.

A further object of the invention is to maintain the sharpest possible laser beam focus region within the liquid plastic tank by ensuring that the incident, ultra-violet laser beam enters said tank at normal incidence through an optically polished window.

A still further object of the invention is to provide the incident laser beam with the largest possible diameter in order to produce the smallest possible focus volume within the liquid plastic so as to control the polymerisation as accurately as possible as the three dimensional hard-copy of the laser beam profiled image is produced.

It is an object of the invention to increase the polymerisation process within the focus volume of the focussed laser beam whilst minimizing the laser beam intensity outside said focus volume by superimposing more than one laser beam focus volume on each to the limits set by the parallax effects induced on said laser beams by the optically polished entrance window.

It is an object of the invention to utilize real time laser beam images for the polymerisation of liquid plastics.

It is a further object of the invention to computer synchronize the buildup of a plastic model via the laser beam polymerisation of liquid plastics and the movement of the face of a piston within said liquid plastic.

It is also an object of the invention to utilize laser beam images for high resolution polymerisation of liquid plastics whilst simultaneously using the focus spot of a focussed laser beam for the rapid polymerisation of the liquid plastic over volumes of the model where high resolution is not a requirement.

The invention is controlled by computers whose software stores data on the three dimensional profiles of the products to be produced. The software then controls the movement and focusing of the laser beams and laser beam images within a layer of liquid plastic relative to the position of the face of a movable piston which is also rotateable in liquid plastic tanks where the diameter of said piston is greater than the diameter of the entrance window of the said tank.

In operation, a customer can request the use of the invention to produce a new bottle of non-standard design and labeling for example. The customer indicates roughly the type of bottle he has in mind and the sketch of said bottle is projected onto a monitor screen. The customer draws in the modifications he desires and the computer aided design facility of the invention optimises said design to match the manufacturing capability of the invention. Once the customer is satisfied with the three dimensional display of his product design, the appropriate labels are inserted together with his selected colour scheme. Once approved, the three dimensional computer screen projection of the product is then processed for laser beam profiling within the liquid plastic tank where it is reproduced as a hard copy via the polymerisation process. Other product formats can be processed by the invention in this manner such as television images, photographic images and the profiled images of actual objects.

Difficult colour schemes are obtained by changing the dyes in the liquid plastic. Where the polymerisation thresholds are laser beam intensity dependent, then liquid plastics which can polymerise in difficult colours different laser beam intensities provide for a multicolour product.

To avoid contamination of either the inner face of the entrance window or the face of the piston within the tank with polymerised plastic, both surfaces are either protected from direct contact with said liquid plastic or the laser beam intensities on these surfaces are maintained well below plastic polymerisation thresholds.

The invention can produce all plastic credit and identification cards by passing a pre-printed plastic card base over the face of the piston within the plastic tank. All personal details of the card holder, including a full colour photograph is then deposited onto the pre-printed base from information stored in the inventions computer and obtained at remote sites via appropriate optical and electronic equipment. Further information can be deposited on said cards in the form of small, micron size plastic spots, the presence of a spot and the lack of a spot at a particular location providing the necessary optical readout for the particular outlet involved, for example banks and supermarkets. The credit cards produced by the invention have the personalized information in the form of a third dimensional profiles on an otherwise flat, pre-printed plastic card. In order to avoid fraud, a clear polymerised plastic layer is deposited over the whole card so that the personalized information becomes a three dimensional distribution of plastic profiles within a thin layer of polymerised liquid plastic. Such credit and identification cards can be produced in a single or multiple unit tank. The invention is also able to manufacture complex models of buildings with internal as well as external features due to the fact that the said model is built up as layered cross-sections. The invention is also able to produce the most detailed dies and moulds for the engineering trade with the information necessary to reproduce any die or mould instantly available within the invention, a very attractive feature when dies and mould are destroyed by fire for example. The invention uses a relatively small amount of expensive liquid plastic at a given time and can, therefore, be scaled up to produce very large plastic models either wholly or sections at a time. For example, the invention is capable of being used to manufacture a large boat or large items of plastic furniture.

Once produced, the plastic product can then be used to form metallic dies and moulds whose applications in industry are well established. However, the production of metallic dies and moulds is a very time consuming process, a costly process which can be cut from several months to several hours with this invention.

DESCRIPTION OF THE PREFERRED EMBODIMENTS

Figure 1:
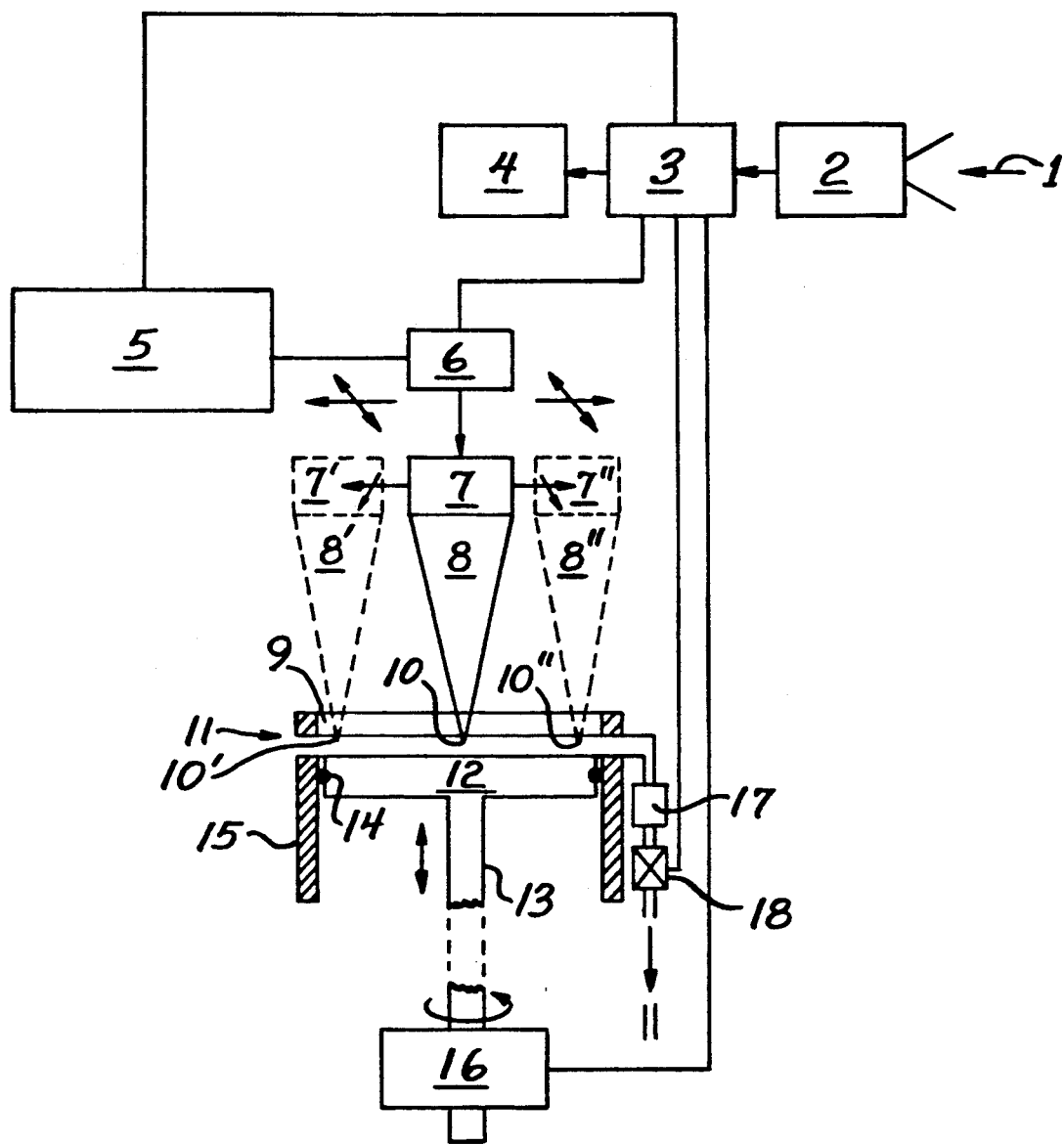
FIG. 1 is a schematic view of a preferred embodiment of the present invention.

A better understanding of the invention may be gained from the following description taken in conjunction with the accompanying drawings. It is emphasized that the ensuing teachings are exemplary and not limitive of the scope of the invention.

In the drawings:

FIG. 1 is a schematic layout of a preferred systems for the focussed laser beam polymerisation of liquid plastic into a three dimensional hard copy within an enclosed tank through which is flowed the said liquid plastic in the volume between the inner face of the entrance window and the end face of a movable piston on which the manufactured model rests. The movement of the end face of said piston relative to the focus of the focussed laser beam as the polymerisation process proceeds and the model is being built up is computer controlled so as to maintain the liquid plastic and polymerised plastic interface always within the intense laser beam focus.

The product to be manufactured is first of all recorded optically and the details fed into a computer which allows a three dimensional image to be displayed on a viewing screen. If the operator is not satisfied with the computer image, it can then be modified until satisfactory. The computer then sets the laser beam generator, laser beam scanners, flow liquid plastic and the piston control system in their operational modes and moves the laser beam to profile the required hard-copy adjusting the piston of the piston face in the process.

Figure 2:
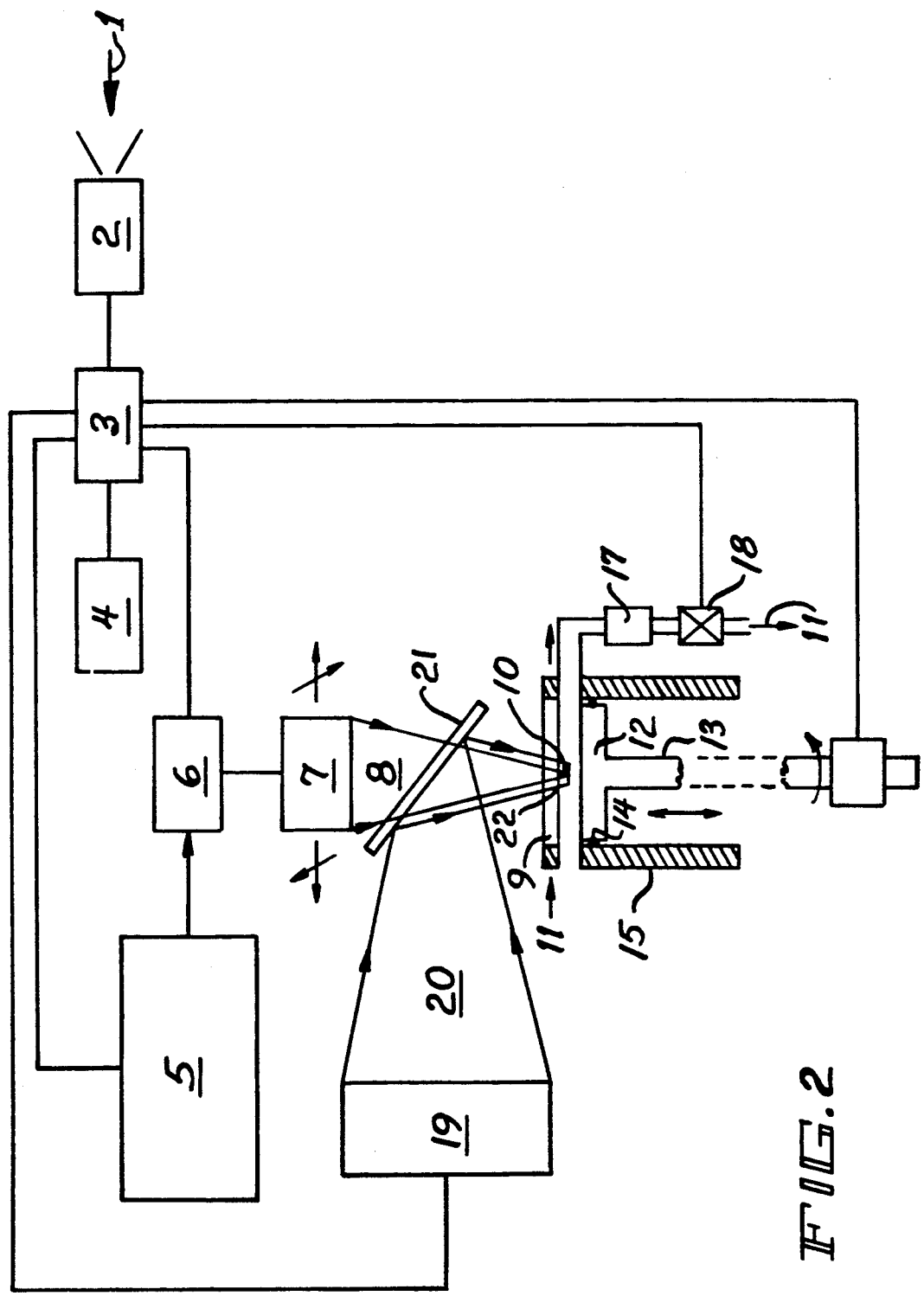
FIG. 2 is a schematic view of a second embodiment of the present invention.

FIG. 2 is a schematic layout of a preferred system for incorporating a laser beam image into the invention for the polymerisation of liquid plastic. For a given setting of the piston face within the tank of liquid plastic the computer generated high definition image projected into the said tank corresponds to a given cross-sectional layer of the product being manufactured. In this way the high resolution regions of the product can be polymerised by the laser beam image whilst the lower resolution portions can be filled in by the focussed laser beam.

Figure 3:
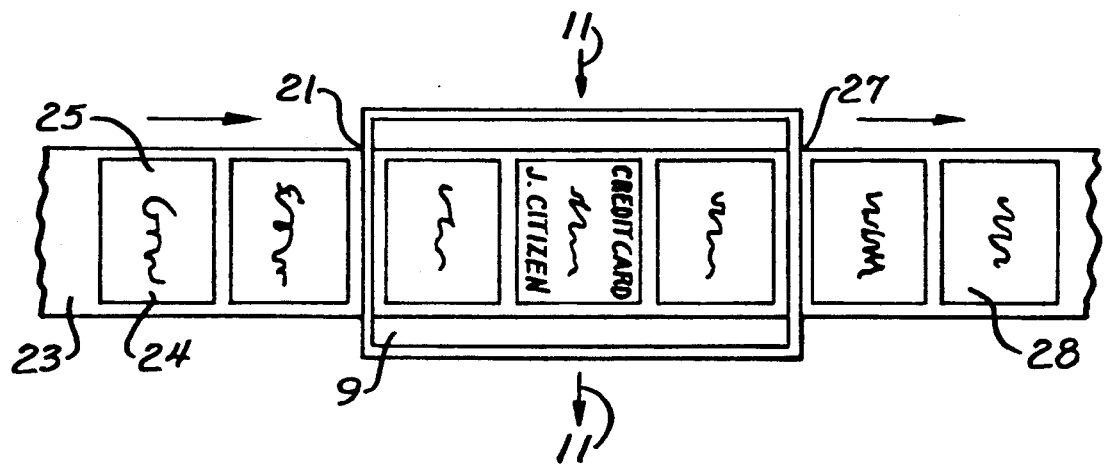
FIG. 3 is a plan view of a first object formed by the invention.

FIG. 3 shows the invention used in the production of credit cards each one of which differs from the other regarding personal details. Pre-printed plastic cards are fed on a continuous belt and the personal details such as photograph, number and expiry date are shown visually. Other personal details are recorded in arrays of plastic blocks each of the order of one micron in diameter which can be read using an optical scanner as known in the art.

Figure 4:
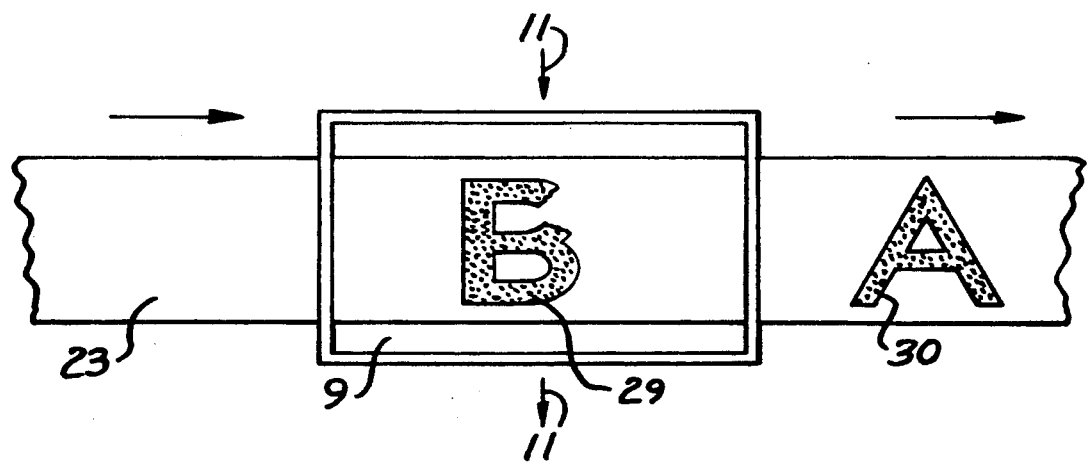
FIG. 4 is a plan view of a second object formed by the invention.

FIG. 4 shows the invention being used to produce plastic lettering.

Figure 5:
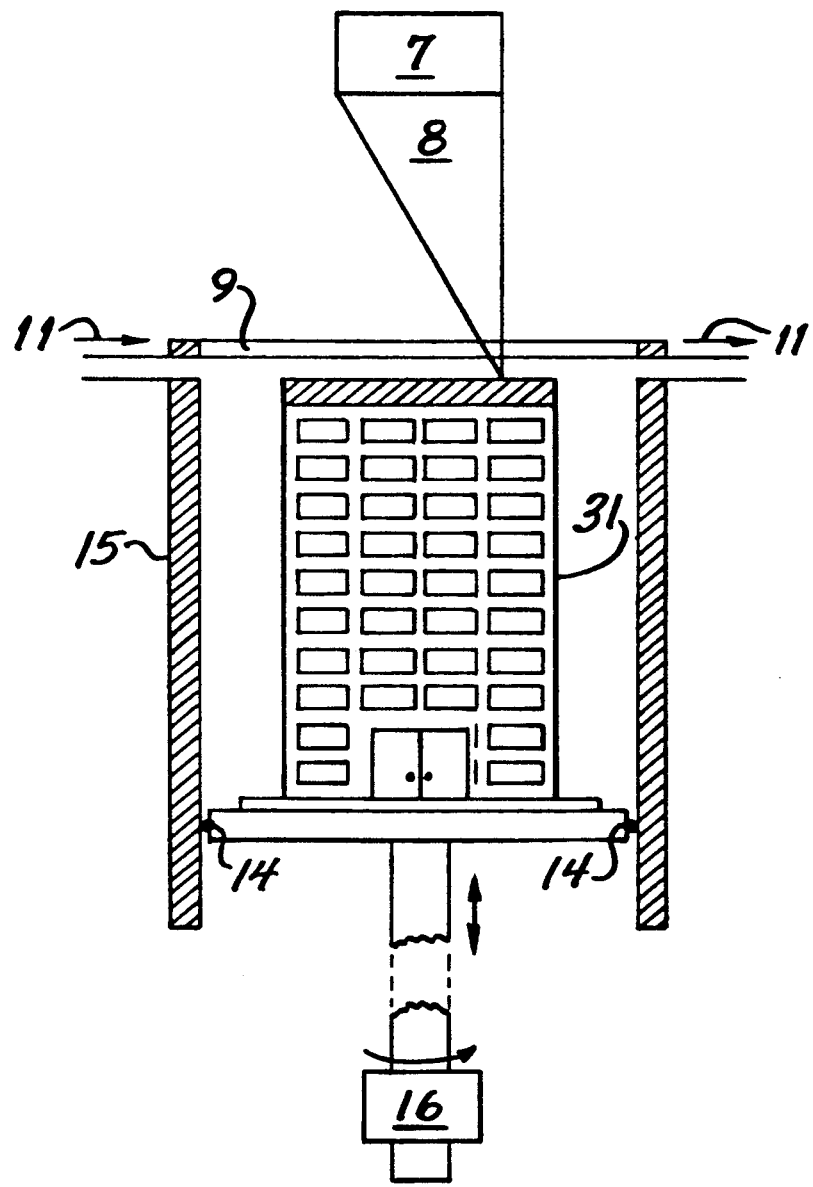
FIG. 5 is a front view of a third object formed by the invention.

FIG. 5 shows the invention being used to produce models of tall buildings.

Figure 6:
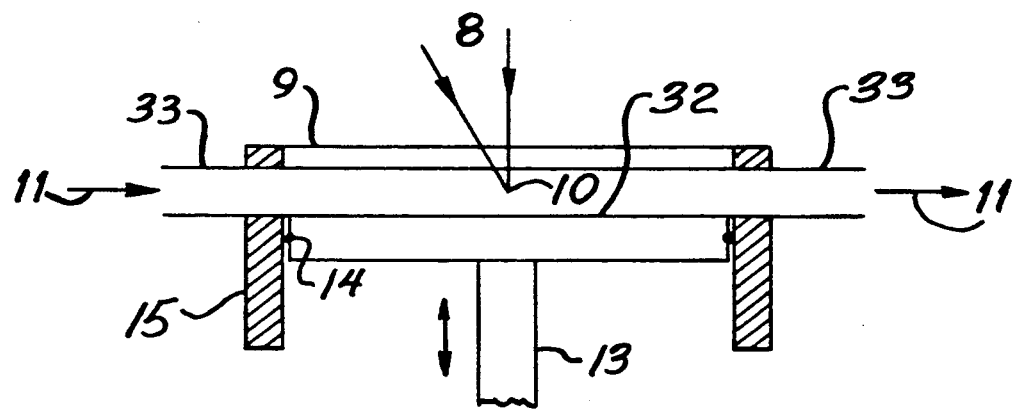
FIG. 6 is a detailed view of the object illustrated in FIG. 5.

FIG. 6 shows the use of a transparent film to protect the underside of the entrance window from the effects of polymerised plastic debris. Also, the material film used to separate the model from the piston face is shown.

Figure 7:
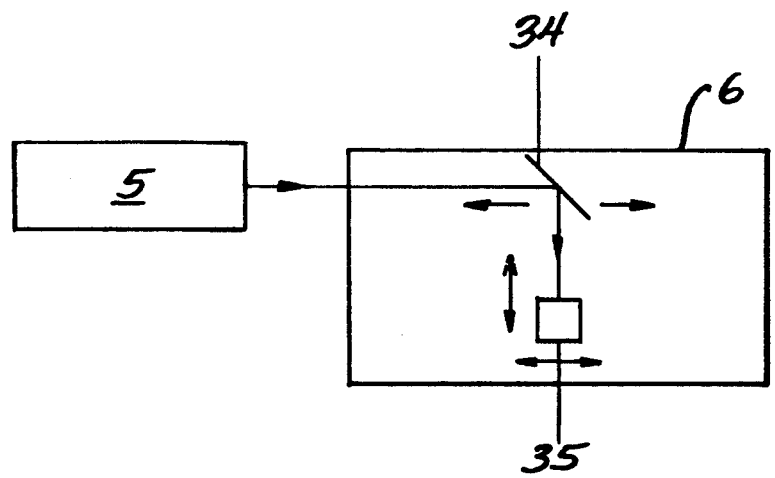
FIG. 7 is a schematic view of a third embodiment of the present invention.

FIG. 7 shows the two mirror beam steering system to project the incoming laser beam through 90° over a given plane.

In FIG. 1, numeral 1 indicates the product data input into the invention via the recording unit indicated by numeral 2. The system computer which stores product information and controls the operation of the system components is indicated by numeral 3. Numeral 4 indicates the viewing screen on which computer generated three dimensional projections of the product is displayed. The laser beam generator is indicated by numeral 5 said laser either generating its output beam directly in the ultra-violet region of the electromagnetic spectrum or generating its output in a wavelength region which can be frequency tuned into the ultra-violet region of the electromagnetic spectrum. Numeral 6 indicates a double mirror laser beam diverting system which allows for the fixed laser beam from 5 to be moved in a plane in two mutually orthogonal directions. Numeral 7 indicates a laser beam scanner which allows focussed laser beam indicated by numeral 8 to be rapidly moved around the normal to the entrance window of the tank indicated by numeral 9. Numerals $7^1$ and $7^{11}$ indicate the positions into which laser beam scanner 7 can be moved to produce focussed laser beams $8^1$ and $8^{11}$ respectively.

Numeral 10 indicates the sharply focussed focus region of the focussed laser beam 8 in the flowing liquid plastic indicated by numeral 11.

Numeral 12 indicates the face of a movable piston indicated by numeral 13 sealed by the O-ring seal indicated by numeral 14 onto the inside surface of the tank casing indicated by numeral 15.

Numeral 16 indicates the computer control motor unit which adjusts the position and arm of piston 13.

Numeral 17 indicates the filter unit used to remove polymerisation debris from the flowing liquid plastic, whilst numeral 18 indicates the pump unit for circulating said plastic.

In FIG. 2, numeral 19 indicates a laser beam image generator which emits the said image in a focussed mode laser beam indicated by numeral 20 to be reflected off the reflector indicated by numeral 21 into a sharply focussed image indicated by numeral 22 within the liquid plastic layer 11.

In FIG. 3, numeral 23 indicates a moving belt onto which are attached pre-printed plastic bases for credit cards indicated by numeral 24 with the pre-printed information indicated by numeral 25. Numeral 26 indicates the slot in the side of the liquid plastic tank through which the cards pass to be deposited with personalized information via the production of plastic lettering, numbers and photographs and recorded data in plastic blob arrays. The cards emerge through the slot indicated by numeral 27 and end up as a finished product indicated by numeral 28.

In FIG. 4, numeral 29 indicates a partly completed letter B produced in the invention whilst numeral 30 indicates a completed letter A.

FIG. 5 shows the invention being used to manufacture a model of a skyscraper indicated by numeral 31. In FIG. 6 numeral 32 indicates the material attached to the piston face 12 on which the model being manufactured will be itself attached.

In FIG. 7, numeral 34 indicates a 45° orieniated laser mirror to deflect a laser beam 5 in the same plane whilst numeral 35 indicates a 45° mirror to reflect said beam at 90° to said plane.

The movable, transparent film used to protect the inside face of the window 9 is indicated by numeral 33.

The invention can also be used to produce signs with coloured plastic letters, numbers and photographs. The invention has particular applications in the production of personalized credit cards, identify cards and security access cards containing information stored in letters, numbers, photographs and in plastic blob arrays providing a machine readable digital data storage systems of high density. For example, several hundred pages of type can be stored in this digital format and machine read.

It should be noted that pre-printed credit card blanks can be inserted into the liquid plastic tank so as to pass over the face of the piston.

The invention has application in the printing industry for producing plastic moulds for printing plates and plastic printing plates which can be mounted directly onto printing presses.

The invention has application in the production of high precision dies for coin and medal production.

The invention is capable of producing full size plastic models of high precision which can either be used directly or to prepare moulds from which metallic models can be cast and mass produced.

It should be noted that if window 9 is of a curved configuration any parallax effects on the transmitted laser beam can be minimized.

It should be noted that the liquid plastic tank of this invention can be inverted without effecting the operation of the invention.

The above teachings may be modified by those skilled in the art within the above described subject matter without departing from the spirit and scope of the invention.

I claim:

1. A system for producing precision plastic products via ultra-violet laser beam polymerization of liquid plastics, comprising:
   a tank for containing liquid ultra-violet curable plastic,
   ultra-violet means for selectively curing a portion of the plastic on a surface thereof, said ultra-violet means having a first ultra-violet part and a second ultra-violet part,
   a movable base means for supporting the selectively cured portion,
   said first ultra-violet part forming an ultra-violet laser beam image which is static for each successive position of said base means for high resolution polymerization,
   said second ultra-violet part forming a focused ultra-violet laser beam spot which is dynamic for each successive position of said base means for low resolution polymerization,
   and control means for controlling said ultra-violet means and said base means such that said base means is successively movable in order to permit said ultra-violet means to selectively cure successive plastic portions, whereby a three-dimensional polymerized plastic object is formed.

2. A system according to claim 1, wherein dimensions of said static image are variable in size for different positions of said base means.

3. A system according to claim 1, wherein said static image are variable in shape with respect to different positions of said base means.

4. A system according to claim 1, wherein said focused laser beam is moved relative to said static laser beam image, in coordination with a specific position of said base means.

5. A system according to claim 1, wherein said base means is sealed inside said tank, a face of said base means forming a base for said cured portion, the position of said base means being adjusted to maintain a liquid plastic-polymerized plastic interface in a plane in which said static image is focused and over which plane said focus spot of said focused laser beam is scanned.

6. A system according to claim 1, further comprising a recirculating filter system for removing polymerization debris from said tank.

7. A system according to claim 1, further comprising a movable, transparent, ultra-violet transmitting film disposed on an entrance window to said tank, said film arranged and constructed to protect said entrance window from polymerization debris.

8. A system according to claim 1, wherein said ultra-violet means forms a multitude of treated areas of approximately one micron in diameter on a plastic card, said areas forming pictorial and alphanumeric data.

9. A system according to claim 1, wherein said static laser beam image is arranged for high resolution polymerization of liquid plastics, said focus spot of said focused incident laser beam is arranged for rapid polymerization of the liquid plastic in regions which do not require high resolution.

10. A system according to claim 1, wherein said laser beams are phased array laser beams.

11. A system according to claim 1, said ultra-violet means further comprising a liquid crystal light valve arranged and constructed to produce a real time static image.

* * * * *